United States Patent
Ou et al.

(10) Patent No.: US 10,770,798 B2
(45) Date of Patent: Sep. 8, 2020

(54) FLEX CABLE FED ANTENNA SYSTEM

(71) Applicant: QUALCOMM Incorporated, San Diego, CA (US)

(72) Inventors: Yu-Chin Ou, San Diego, CA (US); Mohammad Ali Tassoudji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 216 days.

(21) Appl. No.: 16/146,646

(22) Filed: Sep. 28, 2018

(65) Prior Publication Data

US 2020/0106187 A1 Apr. 2, 2020

(51) Int. Cl.
*H01Q 1/38* (2006.01)
*H01Q 13/10* (2006.01)
*H01Q 1/24* (2006.01)
*H05K 1/11* (2006.01)
*H01Q 21/06* (2006.01)

(52) U.S. Cl.
CPC ........... *H01Q 13/106* (2013.01); *H01Q 1/243* (2013.01); *H01Q 1/38* (2013.01); *H01Q 21/067* (2013.01); *H05K 1/11* (2013.01)

(58) Field of Classification Search
CPC ........ H01Q 13/106; H01Q 1/243; H01Q 1/38; H01Q 21/067
See application file for complete search history.

(56) References Cited

U.S. PATENT DOCUMENTS

| 2010/0033393 A1 | 2/2010 | Myszne et al. |
| 2015/0035714 A1 | 2/2015 | Zhou |
| 2017/0309991 A1 | 10/2017 | Noori et al. |

OTHER PUBLICATIONS

Chuang N-C., et al., "Compact Cavity-Backed Dual-Polarized Aperture Antennas for Millimeter Wave MIMO Applications", 2017 IEEE MTT-S International Conference on Microwaves for Intelligent Mobility (ICMIM), 2017, pp. 131-134.Chuang N-C., et al., "Compact Cavity-Backed Dual-Polarized Aperture Antennas for Millimeter Wave MIMO Applications", 2017 IEEE MTT-S International Conference on Microwaves for Intelligent Mobility (ICMIM), 2017, pp. 131-134.
Lin H-S., et al., "Millimeter-wave MIMO Antennas with Polarization and Pattern Lin H-S., et al., "Millimeter-wave MIMO Antennas with Polarization and Pattern Diversity for 5G Mobile Communications", The Corner Design, 2017, pp. 2577-2578.Diversity for 5G Mobile Communications", The Corner Design, 2017, pp. 2577-2578.

*Primary Examiner* — Graham P Smith
(74) *Attorney, Agent, or Firm* — Hunter Clark PLLC

(57) ABSTRACT

A wireless communication antenna system includes: a radio-frequency circuit configured to couple to a printed circuit board; a broadside radiator configured and disposed to radiate first millimeter-wave energy at a first boresight away from a broadside surface of the printed circuit board; an end-fire radiator configured and disposed to radiate second millimeter-wave energy at a second boresight away from a side surface of the printed circuit board; and at least one flex cable each including a substrate, the at least one flex cable including a plurality of signal conductors coupled to the radio-frequency circuit; where at least one of the broadside radiator or the end-fire radiator is a cavity radiator; and where respective signal conductors of the plurality of signal conductors are disposed to excite the broadside radiator and the end-fire radiator.

26 Claims, 11 Drawing Sheets

FLEX CABLE FED ANTENNA SYSTEM

BACKGROUND

Wireless communication devices are increasingly popular and increasingly complex. For example, mobile telecommunication devices have progressed from simple phones, to smart phones with multiple communication capabilities (e.g., multiple cellular communication protocols, Wi-Fi, BLUETOOTH® and other short-range communication protocols), supercomputing processors, cameras, etc. Wireless communication devices have antennas to support communication over a range of frequencies.

It is often desirable to have multiple communication technologies, e.g., to enable multiple communication protocols concurrently, and/or to provide different communication capabilities. For example, as wireless communication technology evolves, mobile communication devices may be configured to communicate using different frequencies, including frequencies below 6 GHz often used for 4G communications or certain WLAN (Wireless Local Area Network) communications, and millimeter-wave frequencies, e.g., above 25 GHz, for 5G communications or other WLAN communications. Communication modules may include arrays of millimeter-wave radiators and/or may use a multi-layered substrate, e.g., to provide arrays, such as wideband, dual-polarization millimeter-wave radiator arrays, and to support signal and power routing to a radio-frequency integrated circuit coupled to the module. These modules may be too thick to attach to existing circuitry (e.g., a printed circuit board) within form factor requirements, e.g., housing size of a mobile phone or tablet computer. Further, the size of the modules may limit location of the modules relative to the circuitry, and may thus limit 4G, 5G, WLAN, etc. communication coverage provided by the modules.

SUMMARY

An example of a wireless communication antenna system includes: a radio-frequency circuit configured to couple to a printed circuit board; a broadside radiator configured and disposed to radiate first millimeter-wave energy at a first boresight away from a broadside surface of the printed circuit board; an end-fire radiator configured and disposed to radiate second millimeter-wave energy at a second boresight away from a side surface of the printed circuit board; and at least one flex cable each including a substrate, the at least one flex cable including a plurality of signal conductors coupled to the radio-frequency circuit; where at least one of the broadside radiator or the end-fire radiator is a cavity radiator; and where respective signal conductors of the plurality of signal conductors are disposed to excite the broadside radiator and the end-fire radiator.

Implementations of such a system may include one or more of the following features. The end-fire radiator is disposed within a thickness of the printed circuit board. The system may include the printed circuit board, where the cavity radiator is disposed within the printed circuit board. Walls of the cavity radiator include vias through layers of the printed circuit board. The system may include the printed circuit board, where the radio-frequency circuit is disposed in a recess defined by the printed circuit board. The system may further include the printed circuit board, where at least one of the broadside radiator or the end-fire radiator includes a first substrate, separate from a second substrate of the printed circuit board, and where the at least one of the broadside radiator or the end-fire radiator is disposed in a corresponding at least one recess defined by the printed circuit board. The first substrate has a higher dielectric constant than the second substrate. The system may include the printed circuit board, where the radio-frequency circuit is electrically connected to the printed circuit board by a ball-grid array. The end-fire radiator is the cavity radiator, and a corresponding one of the plurality of signal conductors wraps around an edge of the printed circuit board and extends partially over an opening of a cavity of the end-fire radiator to excite the end-fire radiator. A wall bounding a portion of the cavity is disposed to provide a ground plane for a portion of the corresponding one of the plurality of signal conductors. The radio-frequency circuit is electrically connected to the at least one flex cable by a ball-grid array.

Another example of a wireless communication antenna system includes: a printed circuit board including an intermediate-frequency circuit; a radio-frequency integrated circuit coupled to the intermediate-frequency circuit of the printed circuit board; a broadside radiator configured and disposed to radiate first millimeter-wave energy at a first boresight away from a broadside surface of the printed circuit board, the broadside radiator comprising a first cavity radiator; an end-fire radiator configured and disposed to radiate second millimeter-wave energy at a second boresight away from a side surface of the printed circuit board, the end-fire radiator comprising a second cavity radiator; and at least one flex cable each including a substrate, the at least one flex cable including a plurality of signal conductors being coupled to the radio-frequency integrated circuit; where the broadside radiator and the end-fire radiator are disposed within a volume defined by a length of the printed circuit board, a width of the printed circuit board, and a thickness of the printed circuit board; and where respective signal conductors of the plurality of signal conductors are disposed to excite the broadside radiator and the end-fire radiator.

Implementations of such a system may include one or more of the following features. Each of the end-fire radiator and the broadside radiator is disposed within the printed circuit board. At least one wall of the broadside radiator and at least one wall of the end-fire radiator comprise vias through layers of the printed circuit board. The radio-frequency integrated circuit is disposed in a recess defined by the printed circuit board. At least one of the broadside radiator or the end-fire radiator includes a first substrate, separate from a second substrate of the printed circuit board, and the at least one of the broadside radiator or the end-fire radiator is disposed in a corresponding at least one recess defined by the printed circuit board, the first substrate having a higher dielectric constant than the second substrate. The radio-frequency integrated circuit is electrically connected to the printed circuit board by a ball-grid array. A corresponding one of the plurality of signal conductors wraps around an edge of the printed circuit board and extends partially over an opening of a cavity of the end-fire radiator to excite the end-fire radiator. A wall bounding a portion of the end-fire radiator is disposed to provide a ground plane for a portion of the corresponding one of the plurality of signal conductors. The printed circuit board includes a plurality of traces to provide ground planes for at least some of the plurality of signal conductors such that the plurality of traces and the at least some of the plurality of signal conductors are microstrip transmission lines.

Another example of a wireless communication antenna system includes: a radio-frequency integrated circuit; a printed circuit board including a intermediate-frequency circuit coupled to the radio-frequency integrated circuit, the printed circuit board including: a first radiator array comprising a first plurality of cavity radiators each configured and disposed to radiate first millimeter-wave energy at a first boresight away from a broadside surface of the printed circuit board; and a second radiator array comprising a second plurality of cavity radiators each configured and disposed to radiate second millimeter-wave energy at a second boresight away from a side surface of the printed circuit board; the system further including at least one flex cable each including a substrate, the at least one flex cable including a plurality of signal conductors coupled to the radio-frequency integrated circuit and being disposed to excite the first plurality of cavity radiators and the second plurality of cavity radiators.

Implementations of such a system may include one or more of the following features. Walls of each of the first plurality of cavity radiators and walls of each of the second plurality of cavity radiators comprise vias through layers of the printed circuit board. The radio-frequency integrated circuit is disposed in a recess defined by the printed circuit board. The radio-frequency integrated circuit is electrically connected to the printed circuit board by a ball-grid array. The printed circuit board comprises a plurality of traces to provide ground planes for at least some of the plurality of signal conductors such that the plurality of traces and the at least some of the plurality of signal conductors are microstrip transmission lines. The system may include an interposer disposed between the radio-frequency integrated circuit and the at least one flex cable and electrically coupled to the radio-frequency integrated circuit and the at least one flex cable.

DETAILED DESCRIPTION

Techniques are discussed herein for providing one or more radiators, e.g., end-fire millimeter-wave radiators, in a wireless communication system. For example, one or more flex cables may be connected to a radio-frequency circuit and electromagnetically coupled to one or more corresponding radiators. In particular, a radio-frequency integrated circuit (RFIC) may be connected to flex cables that are coupled to cavity radiators that are disposed within a volume defined by a printed circuit board (PCB) of a wireless communication device such as a mobile phone or a tablet computer. The cavity radiators may be disposed within a substrate of the PCB, with end-fire radiators disposed within a thickness of the PCB and configured and disposed to radiate outwardly from one or more sides of the PCB, and with broadside radiators disposed within the thickness of the PCB and configured and disposed to radiate outwardly from a broadside surface of the PCB. The flex cable(s) can convey signals between the radiators and the RFIC with low loss. The flex cable(s) can be placed to convey signals to, excite, and receive signals from, the end-fire radiator(s), e.g., by wrapping over an edge of the PCB. Other configurations, however, may be used.

Items and/or techniques described herein may provide one or more of the following capabilities, as well as other capabilities not mentioned. A low-cost, wideband, dual-polarization, millimeter-wave antenna system may be provided. Millimeter-wave radiators may be placed to radiate from a thin edge (e.g., perpendicular to a thickness) of a printed circuit board of a wireless communication device. Millimeter-wave radiation may be added to a wireless communication system antenna system with negligible thickness increase compared to the antenna system without the millimeter-wave radiation capability. A millimeter-wave system may be simplified, e.g., by having fewer layers, if antennas are disposed in a main printed circuit board of a device instead of in a separate millimeter-wave module. Millimeter-wave radiators may be provided separately from a radio-frequency circuit, e.g., not in a single physical unit containing the radiators and the radio-frequency circuit. Millimeter-wave radiators can be more easily placed in a wireless communication system and/or more easily coupled to a radio-frequency circuit for exchange of millimeter-wave signals between the radiators and the radio-frequency circuit, e.g., using flex cables to couple the radiators and the radio-frequency circuit. Thickness of a wireless communication antenna system that includes millimeter-wave radiators may be reduced. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

Figure 1:
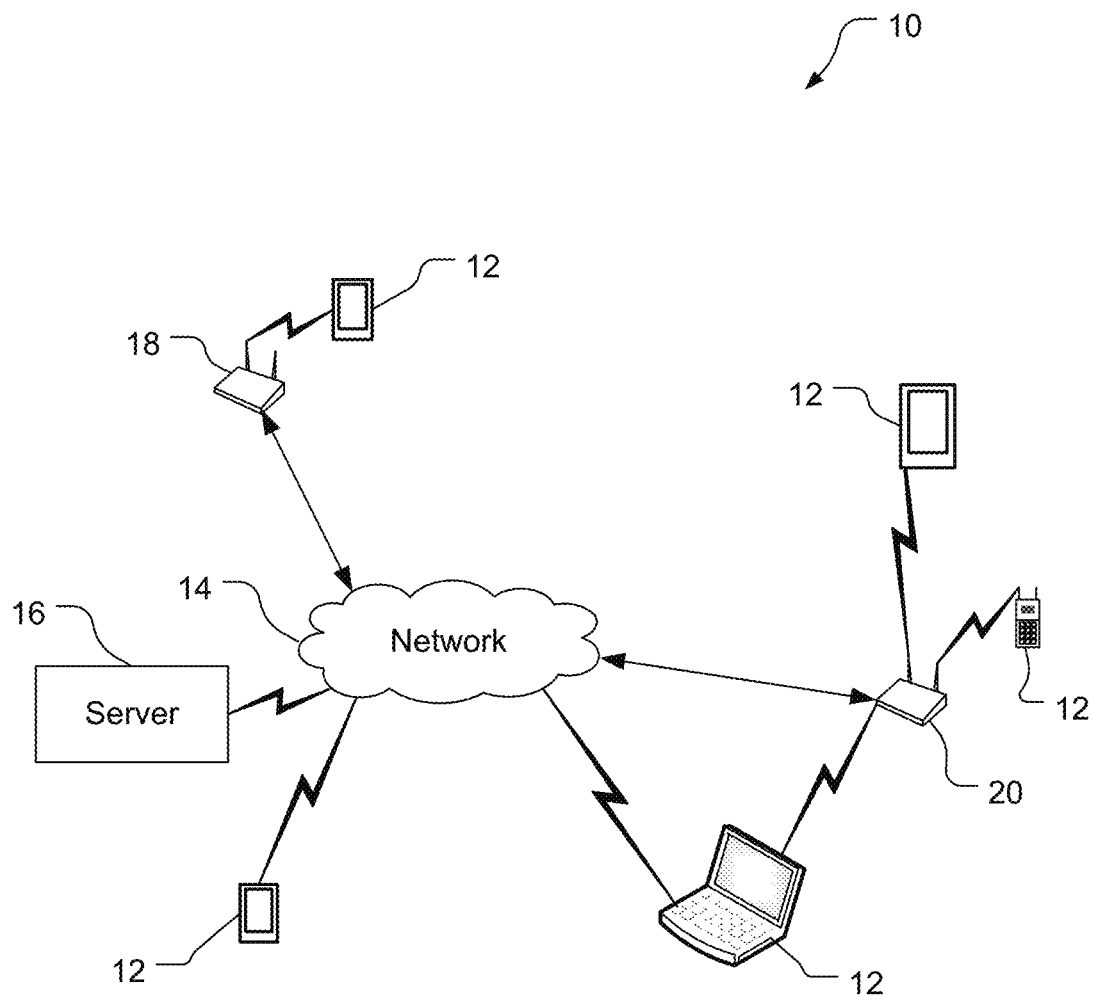
FIG. 1 is a schematic diagram of a communication system.

Referring to FIG. 1, a communication system 10 includes mobile devices 12, a network 14, a server 16, and access points (APs) 18, 20. The system 10 is a wireless communication system in that components of the system 10 can communicate with one another (at least some times using wireless connections) directly or indirectly, e.g., via the network 14 and/or one or more of the access points 18, 20 (and/or one or more other devices not shown, such as one or more base transceiver stations). For indirect communications, the communications may be altered during transmission from one entity to another, e.g., to alter header information of data packets, to change format, etc. The mobile devices 12 shown are mobile wireless communication devices (although they may communicate wirelessly and via wired connections) including mobile phones (including smartphones), a laptop computer, and a tablet computer. Still other mobile devices may be used, whether currently existing or developed in the future. Further, other wireless devices (whether mobile or not) may be implemented within the system 10 and may communicate with each other and/or with the mobile devices 12, network 14, server 16, and/or APs 18, 20. For example, such other devices may include internet of thing (IoT) devices, medical devices, home entertainment and/or automation devices, etc. The mobile devices 12 or other devices may be configured to communicate in different networks and/or for different purposes (e.g., 5G, Wi-Fi communication, multiple frequencies of Wi-Fi communication, satellite positioning, one or more types of cellular communications (e.g., GSM (Global System for Mobiles), CDMA (Code Division Multiple Access), LTE (Long-Term Evolution), etc.).

Figure 2:
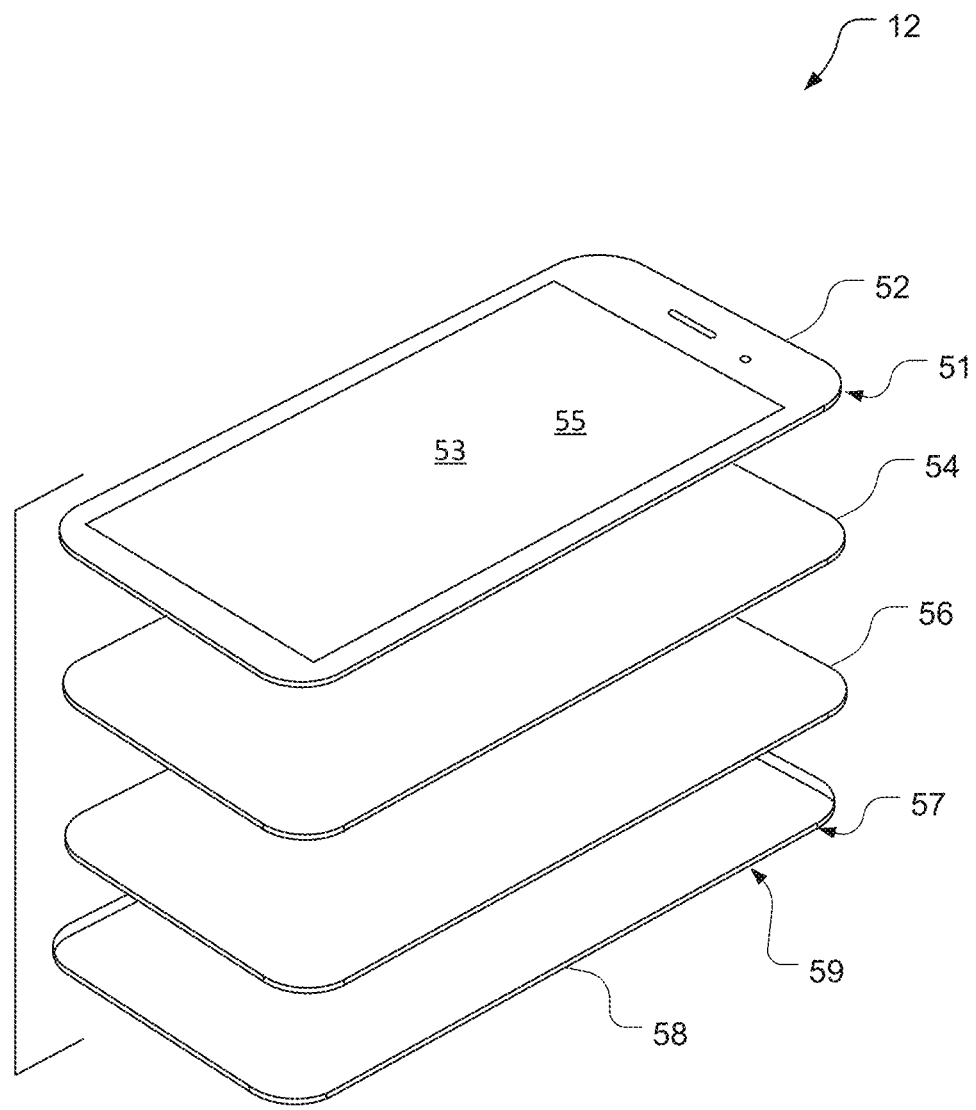
FIG. 2 is an exploded perspective view of simplified components of a mobile device shown in FIG. 1.

Referring to FIG. 2, an example of one of the mobile devices 12 shown in FIG. 1 includes a top cover 52, a display layer 54, a printed circuit board (PCB) layer 56, and a bottom cover 58. The mobile device 12 as shown may be a smartphone or a tablet computer but the discussion is not limited to such devices. The top cover 52 includes a screen 53. The PCB layer 56 includes one or more antennas configured to facilitate bi-directional communication between mobile device 12 and one or more other devices, including other wireless communication devices. The bottom cover 58 has a bottom surface 59 and sides 51, 57 of the top cover 52 and the bottom cover 58 provide an edge surface. The top cover 52 and the bottom cover 58 comprise a housing that retains the display layer 54, the PCB layer 56, and other components of the mobile device 12 that may or may not be on the PCB layer 56. For example, the housing may retain (e.g., hold, contain) antenna systems, front-end circuits, an intermediate-frequency circuit, and a processor discussed below. Further, the size and/or shape of the PCB layer 56 may not be commensurate with the size and/or shape of either of the top or bottom covers or otherwise with a perimeter of the device. For example, the PCB layer 56 may have a cutout to accept a battery. Those of skill in the art will therefore understand that embodiments of the PCB layer 56 other than those illustrated may be implemented.

Figure 3:
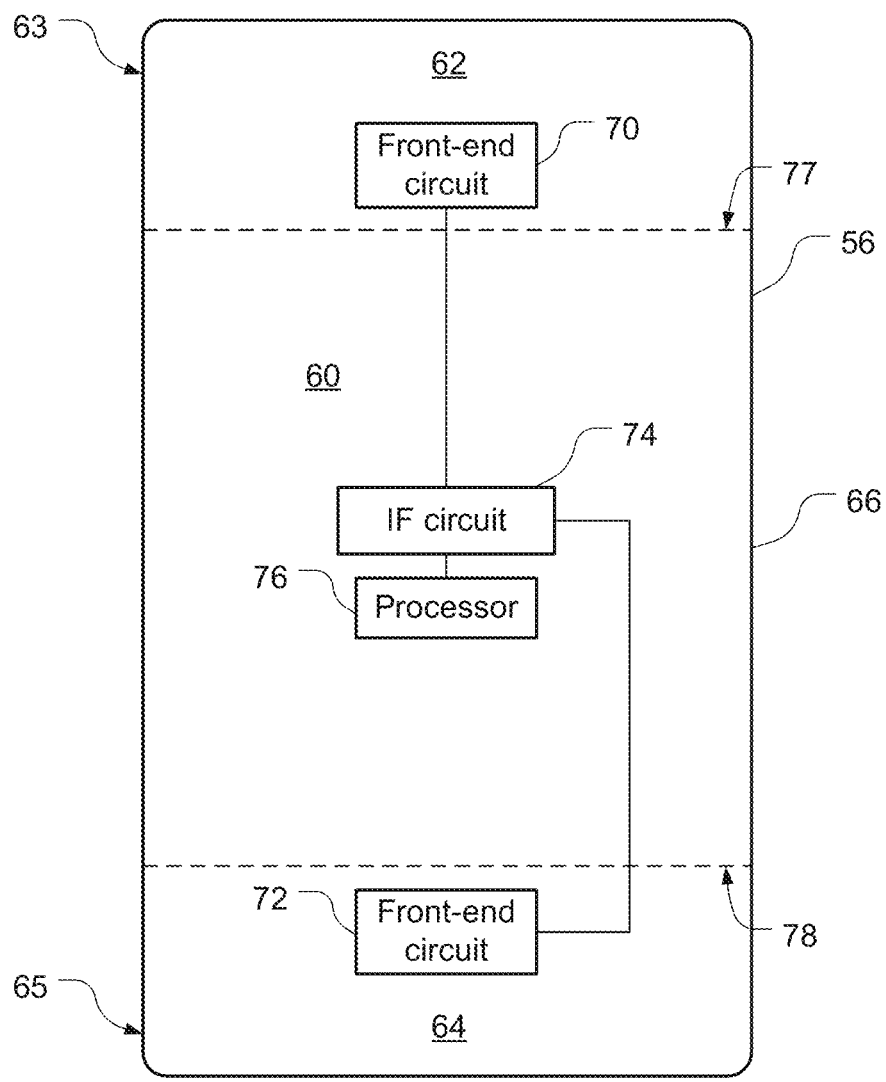
FIG. 3 is a top view of a printed circuit board layer, shown in FIG. 2, including antenna systems.

Referring also to FIG. 3, an example of the PCB layer 56 includes a main portion 60 and two antenna systems 62, 64. In the example shown, the antenna systems 62, 64 are disposed at opposite ends 63, 65 of the PCB layer 56, and thus, in this example, of the mobile device 12 (e.g., of the housing of the mobile device 12). In this example, the antenna systems 62, 64 include front-end circuits 70, 72 (also called radio frequency (RF) circuits), respectively. Alternatively, the front-end circuits 70, 72 may be included in the main portion 60. The main portion 60 may comprise a PCB 66, an intermediate-frequency (IF) circuit 74, and a processor 76. The IF circuit 74, and/or the processor 76 may be part of the PCB 66 or separate from, but attached to, the PCB 66. One or more of the front-end circuits 70, 72 may be an RF integrated circuit (RFIC). The front-end circuits 70, 72 are configured to provide signals to be radiated to the antenna systems 62, 64 and to receive and process signals that are received by, and provided to the front-end circuits 70, 72 from, the antenna systems 62, 64. The front-end circuits 70, 72 are coupled to the IF circuit 74, are configured to convert received IF signals from the IF circuit 74 to RF signals (amplifying with a power amplifier as appropriate), and are configured to provide the RF signals to the antenna systems 62, 64 for radiation. The front-end circuits 70, 72 are configured to convert RF signals received by the antenna systems 62, 64 to IF signals (e.g., using a low-noise amplifier and a mixer) and to send the IF signals to the IF circuit 74. The IF circuit 74 is configured to convert IF signals received from the front-end circuits 70, 72 to baseband signals and to provide the baseband signals to the processor 76. The IF circuit 74 is also configured to convert baseband signals provided by the processor 76 to IF signals, and to provide the IF signals to the front-end circuits 70, 72. The processor 76 is communicatively coupled to the IF circuit 74, which is communicatively coupled to the front-end circuits 70, 72, which are communicatively coupled to the antenna systems 62, 64, respectively.

The antenna systems 62, 64 may be formed as part of the PCB layer 56 in a variety of manners. In FIG. 3, the dashed lines separating the antenna systems 62, 64 from the PCB 66 indicate functional separation of the antenna systems 62, 64 (and the components thereof) from other portions of the PCB layer 56. The antenna systems 62, 64 may be integral with the PCB 66, being formed as integral components of the PCB 66 or may be separate from, but attached to, the PCB 66. Alternatively, one or more components of the antenna system 62 and/or the antenna system 64 may be formed integrally with the PCB 66, and one or more other components may be formed separate from the PCB 66 and mounted to the PCB 66, or otherwise made part of the PCB layer 56. Alternatively, each of the antenna systems 62, 64 may be formed separately from the PCB 66 and mounted to the PCB 66 and coupled to the front-end circuits 70, 72, respectively. In some embodiments, one or both of the front-end circuits 70, 72 are implemented with the antenna system 62 or 64 in a module and coupled to the PCB 66. For example, the module may be mounted to the PCB 66 or may be spaced from the PCB 66 and coupled thereto, for example using flexible cable or a flexible circuit. The antenna systems 62, 64 may be configured similarly to each other or differently from each other. For example, one or more components of either of the antenna systems 62, 64, may be omitted. As an example, the antenna system 62 may include 4G and 5G radiators while the antenna system 64 may not include (may omit) a 5G radiator. In other examples, an entire one of the antenna systems 62, 64 may be omitted or may be configured for use with a non-cellular technology such as a WLAN technology.

A display 61 (see FIG. 2) of the display layer 54 may roughly cover the same area as the PCB 66 and serve as a system ground plane for the antenna systems 62, 64 (and possibly other components of the device 12). The display 61 is disposed below the antenna system 62 and above the antenna system 64 (with "above" and "below" being relative to the mobile device 12, i.e., with a top of the mobile device 12 being above other components regardless of an orientation of the device 12 relative to the Earth).

Figure 4:
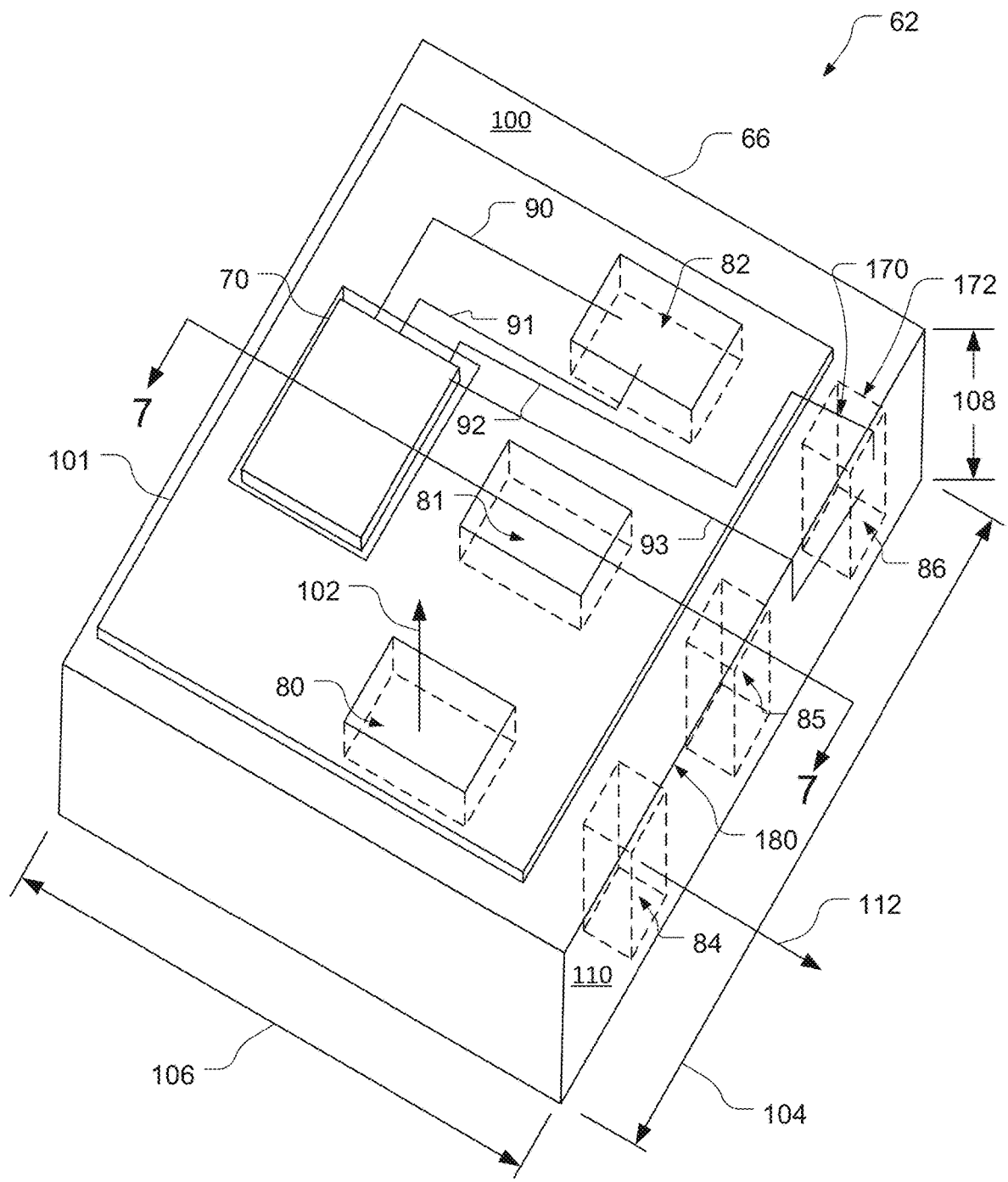
FIG. 4 is a perspective view of an example of an antenna system shown in FIG. 3.

Referring also to FIG. 4, a simplified example of the antenna system 62 includes the front-end circuit 70 (here an RFIC), three broadside cavity radiators 80, 81, 82, three end-fire cavity radiators 84, 85, 86, flex cables 90, 91, 92, 93, and a portion of the PCB 66. End-fire radiators are radiators configured and disposed to radiate energy from a side of the PCB 66, and may be any of a variety of types of radiators, in this example being cavity radiators. While three broadside cavity radiators 80-82 and three end-fire cavity radiators 84-86 are shown, other quantities of broadside radiators and/or other quantities of end-fire radiators may be used. Further, other types of radiators, e.g., one or more patch radiators and/or one or more dipole radiators, etc., may be used and multiple types of radiators may be used in a single antenna system. In the example shown, only flex cables between the RFIC 70 and the cavity radiators 82, 86 are shown in order to simplify the figure, but flex cables may be provided between the RFIC and the cavity radiators 80, 81, 84, 85. Further, while flex cables 90-93 are described herein as a plurality of flex cables, these elements (and other elements coupling the RFIC 70 to one or more cavity radiators) may be configured as a plurality of conductors within a single (or several) flex cables. Also or alternatively, one or more of the flex cables 90-93 may be implanted in a flexible printed circuit (FPC). Also or alternatively, one or more of the flex cables 90-93 may have shielding, e.g., to inhibit interference of and/or by the shielded flex cable(s). In such case, the shielding will be configured (e.g., disposed) to permit the flex cable to act as a transmission line for appropriate signals. The broadside cavity radiators 80-82 are disposed and configured to radiate millimeter-wave energy away from a broadside surface 100 of the PCB 66, e.g., with a boresight direction 102 of the broadside cavity radiators 80-82 being orthogonal to the broadside surface 100 (perpendicular to a length 104 and a width 106 of the portion of the PCB 66 of the antenna system 62). A boresight direction may, however, be in another direction (i.e., not orthogonal to the broadside surface 100). Also or alternatively, signals may be radiated in directions other than boresight, e.g., with a main beam directed at an angle other than boresight (e.g., a main beam may be scanned, e.g., with the cavity radiators 80-82 fed as a phased array). An electrically-conductive sheet 101 (e.g., made of metal) is disposed on the surface 100 and defines an opening for the RFIC 70 and defines openings for the broadside cavity radiators 80-82. The end-fire cavity radiators 84-86 are disposed and configured to radiate millimeter-wave energy away from a side surface 110 of the PCB 66, e.g., with a boresight direction 112 of the end-fire cavity radiators 84-86 being orthogonal to the side surface 110 (perpendicular to the length 104 and a thickness 108 of the portion of the PCB 66 of the antenna system 62). The antenna system 62 is configured to provide dual-polarization broadside and end-fire millimeter-wave radiators in a thickness similar to a thickness of the PCB 66 without the antenna system 62 included. For example, the thickness of the antenna system 62 may be about 0.2 mm greater than the thickness 108 of the PCB 66 alone. In this example, the radiators 80-82, 84-86 are cavity radiators but one or more of these radiators could be a different type of radiator, e.g., a patch radiator, a dipole radiator, a monopole radiator, etc. Further, here the radiators 80-82, 84-86 are disposed within the PCB 66 (within the thickness of the PCB 66), but one or more radiators may be disposed outside, e.g., on or extending from a surface of, the PCB 66. The radiators 80-82 and the radiators 84-86 may have similar sizes and shapes. In some embodiments, one or more of the radiators 80-82 and/or the radiators 84-86 provide single polarization instead of dual polarization.

Figure 5:
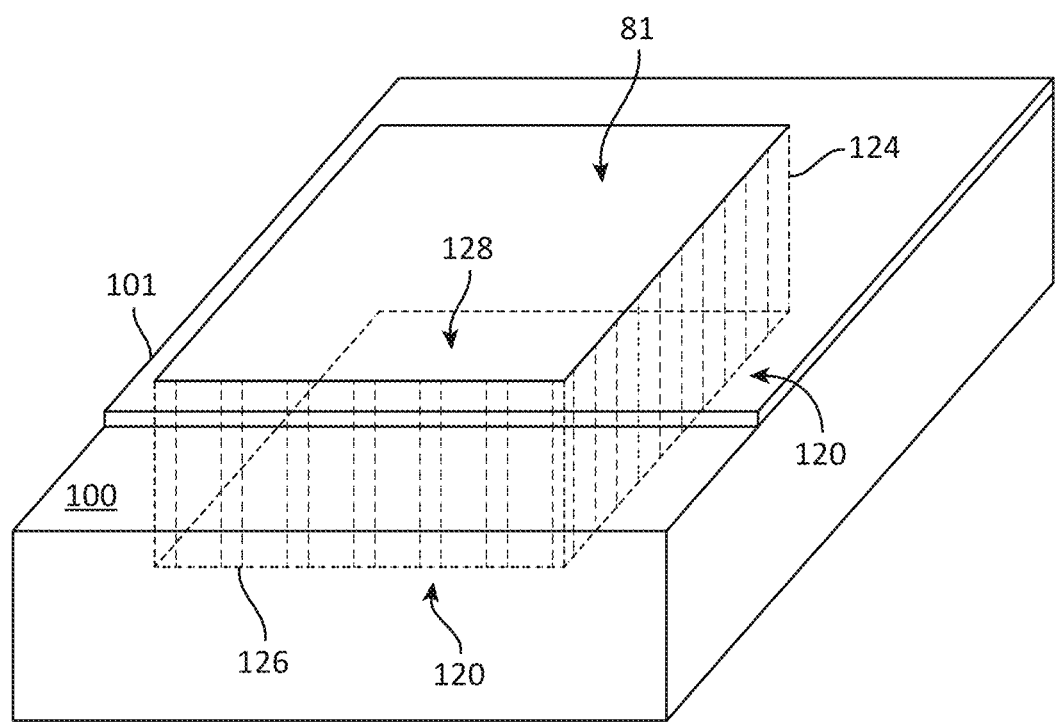
FIG. 5 is a perspective view of a broadside radiator shown in FIG. 4.
Figure 6:
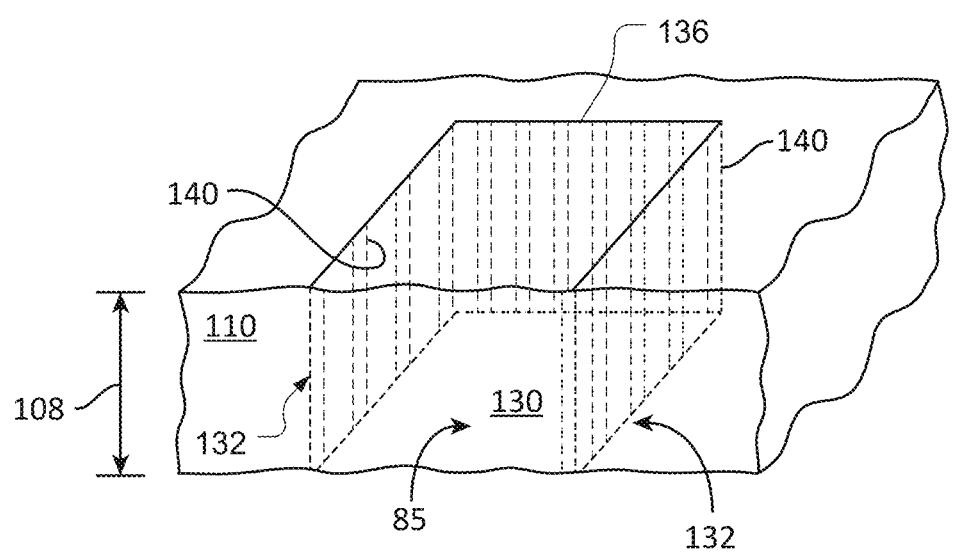
FIG. 6 is a perspective view of an end-fire radiator shown in FIG. 4.
Figure 7:
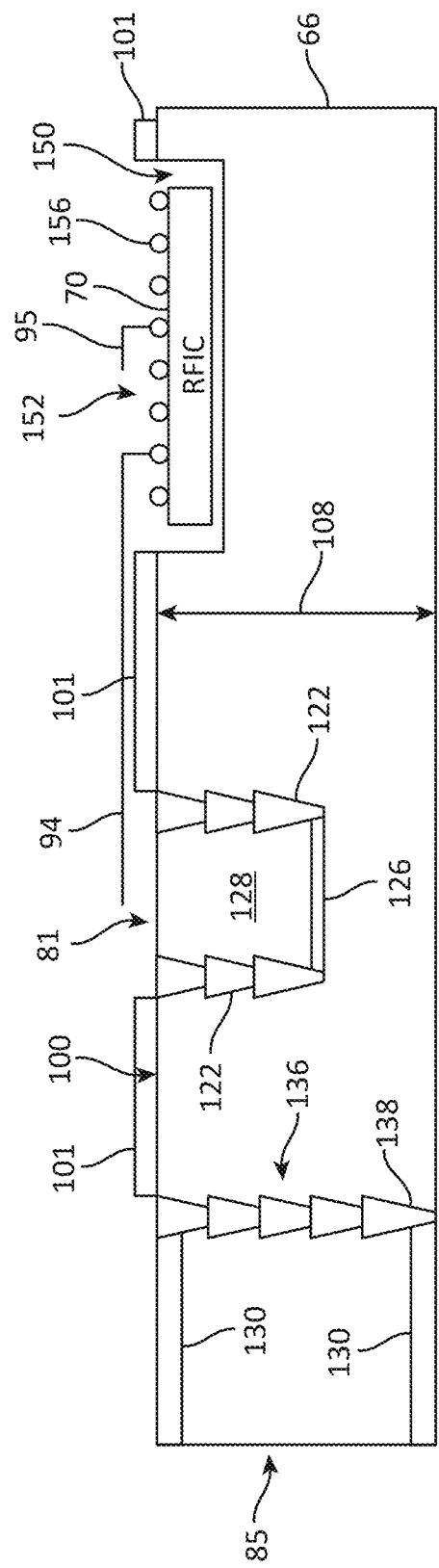
FIG. 7 is a cross-sectional view of the antenna system shown in FIG. 4.

Referring also to FIGS. 5-7, the cavity radiators 80-82, 84-86 comprise walls of conductive vias and conductive plating in appropriate layers of the PCB 66. As shown in FIGS. 5 and 7, the broadside cavity radiator 81 comprises side walls 120 of electrically-conductive vias 122 forming electrically-conductive posts 124. Each of the vias 122 extends through a respective layer of the PCB 66 and is made of an electrically-conductive material (e.g., metal). The side walls 120 as shown are not solid walls, with the posts 124 being separated from each other. The posts 124 are preferably spaced less than a quarter of a wavelength apart, with the wavelength being the wavelength in a substrate of the PCB 66 corresponding to a highest frequency signal to be fed to the cavity radiator 81. The PCB 66 may comprise any of a variety of substrates such as FR4, which is a well-known material comprising a glass-reinforced epoxy laminate with a dielectric constant of about four. The cavity radiator 81 extends downwardly from the broadside surface 100 of the PCB 66. A bottom wall 126 is made of an electrically-conductive sheet disposed in the appropriate layer of the PCB 66 to provide a desired depth of the cavity radiator 81. As shown, a depth of the cavity radiator 81 is less than the thickness 108 of the PCB 66. The side walls 120 (only two of four side walls of the cavity radiator 81 are shown in FIG. 5 for clarity of the figure) and the bottom wall 126 define a cavity 128 of the cavity radiator 81. The cavity 128 is filled with the substrate of the PCB 66.

As shown in FIGS. 6-7, the end-fire cavity radiator 85 comprises side walls 130 of electrically-conductive plating in appropriate layers of the PCB 66, and side walls 132 and an end wall 136 of electrically-conductive vias 138 forming electrically-conductive posts 140. In this example, the cavity radiator 85 extends inwardly from the side surface 110 of the PCB 66 and extends the entire thickness 108 of the PCB 66. The radiators 80-82, 84-86 shown in FIG. 4 are simplified representations of the radiators to reduce the complexity of the figure and do not show the details of the walls, e.g., the vias forming the walls. Dummy metal may be disposed in any of the cavities of the cavity radiators 80-82, 84-86 to increase isolation between the radiators. While the side walls 130 are shown being in the PCB 66, the sheet 101 could be used to form a side wall (here a top side wall as shown) of the cavity radiator 85 (and/or a side wall of other cavity radiator(s)).

Referring to FIGS. 4 and 7, the RFIC 70 is disposed in a recess 150 defined by (e.g., etched into) the PCB 66, with an opening 152 defined by the sheet 101 providing access to the RFIC 70. In the configuration shown in FIGS. 4 and 7, the RFIC 70 is on one end and the broadside radiators 80-82 are disposed between the RFIC 70 and the end-fire radiators 84-86, but other configurations may be used. For example, the RFIC may be disposed in the middle, the broadside radiators disposed on one side of the RFIC, and the end-fire radiators disposed on the other side of the RFIC. The RFIC 70 is configured to be coupled to the PCB 66, e.g., having electrical contacts on a bottom side of the RFIC 70. As shown, here the RFIC 70 is coupled to flex cables by a ball-grid array (BGA) of electrically-conductive balls 156 (e.g., blobs made of metal). In this example, the RFIC 70 is connected to a flex cable 94 configured and disposed to feed the radiator 81 and a flex cable 95 configured and disposed to excite the radiator 85 (although only a portion of the flex cable 95 is shown in the cross-sectional view that is FIG. 7). The RFIC 70 is further coupled to flex cables (not shown) that connect to the PCB 66 for carrying appropriate signals (e.g., intermediate-frequency signals), bias voltage, and/or grounding. A heat sink may be provided at the bottom of the recess 150 and appropriate metallization provided on the bottom of the RFIC 70 to dissipate heat from the RFIC 70 in to the PCB 66.

Figure 8:
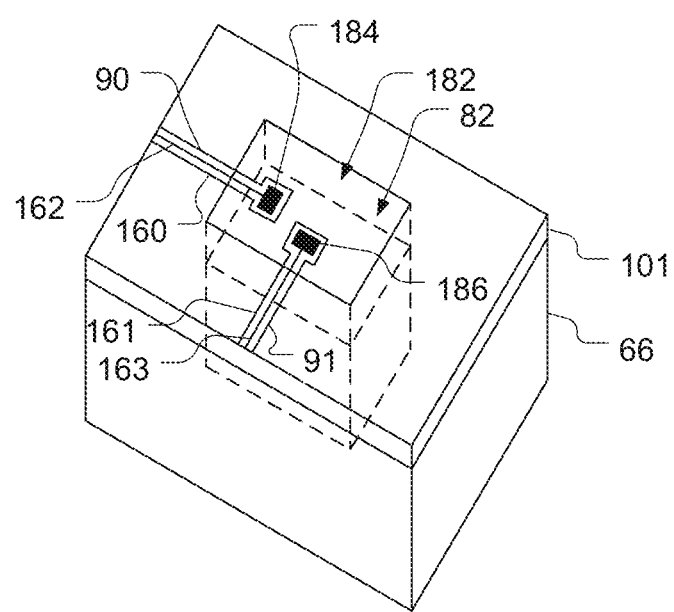
FIG. 8 is a perspective view of a broadside radiator and feed mechanisms shown in FIG. 4.

Referring again to FIG. 4, with further reference to FIG. 8, flex cables are coupled to the RFIC 70 and configured and disposed to excite the cavity radiators 80-82, 84-86. For example, the cavity radiator 82, end portions of the flex cables 90, 91, and a portion of the sheet 101 surrounding the radiator 82 are shown in FIG. 8. In the example shown in FIG. 4, two flex cables are coupled to each of the radiators 80-82, 84-86 and disposed to excite (and receive) signals of two orthogonal polarizations at each of the radiators 80-82, 84-86. For example, the flex cables 90-93 shown in FIG. 4 are configured and disposed to couple the RFIC 70 to the broadside cavity radiator 82 and the end-fire cavity radiator 86 for dual-polarization excitation and reception of millimeter-wave signals. As shown in FIG. 8, the flex cables 90, 91 include substrates 160, 161 and signal conductors 162, 163, respectively. The signal conductors 162, 163 are electrically-conductive lines, e.g., metal traces printed on the substrates 160, 161. The substrates 160, 161 may be the same substrate and are disposed between the signal conductors 162, 163 and the PCB 66 or the sheet 101. The substrates 160, 161 may enclose (surround) the signal conductors 162, 163 such that the signal conductors are disposed inside the substrates 160, 161. The substrates 160, 161 may have dielectric constants between about 2 and about 3, and a thickness of about 0.2 mm (while enclosing the signal conductors 162, 163). The flex cables 90, 91 are configured to have low loss, e.g., lower than a loss if the signal conductors 162, 163 were provided as traces on the substrate of the PCB 66. The substrates 160, 161 may be made thicker and/or smoothness of the signal conductors 162, 163 increased to lower the loss. The other flex cables (i.e., the flex cables 92, 93 and the flex cables, not shown, for the other radiators) may be configured similarly. The substrates are not shown in FIG. 4 or 7, but are shown in FIG. 8, on the flex cables 90-93 in order to reduce the complexity of FIGS. 4 and 7. The antenna system 62 includes at least one flex cable. Each of the at least one flex cable includes a substrate. The at least one flex cable may include multiple signal conductors for exciting and receiving signals from multiple radiators and/or for exciting and receiving signals from one radiator with a plurality of polarizations. For example, multiple signal conductors may be provided between multiple radiators and, e.g., an RFIC, although it is possible that no single flex cable contains more than one signal conductor, and/or it is possible that no radiator has more than one signal conductor associated with the radiator.

The flex cables are disposed to convey signals to and from corresponding radiators. The flex cables may be shaped to be laid flat on the sheet 101 and/or the PCB 66 to connect the RFIC 70 and corresponding radiators, or may be manipulated and attached to the sheet 101 and/or the PCB 66 to convey signals between the RFIC 70 and corresponding radiators. Flex cables may be attached to the PCB by, for example, adhesive and/or fasteners (e.g., screws). Flex cables may be wrapped around edges of the PCB 66 to convey signals between the RFIC 70 and corresponding radiators. For example, the flex cables 92, 93 wrap around (e.g., are folded over or bent around, for example at an angle of approximately 90°) an edge 180 (FIG. 3) of the PCB 66 in order to electrically couple the RFIC 70 and the end-fire radiator 86. Flex cables may be adhered as appropriate, e.g., to the PCB 66 and/or the sheet 101, to stay in place and couple the RFIC 70 to corresponding radiators. Multiple signal conductors may be disposed in a single flex cable substrate, e.g., sharing the substrate near to the RFIC 70 but being separate near and at a radiator. For example, the substrates 160, 161 could be a single, monolithic substrate near the RFIC 70 but be separate near the radiator 82 such that the signal conductors 162, 163 feed the radiator 82 from different angles and at different entry points.

Figure 9:
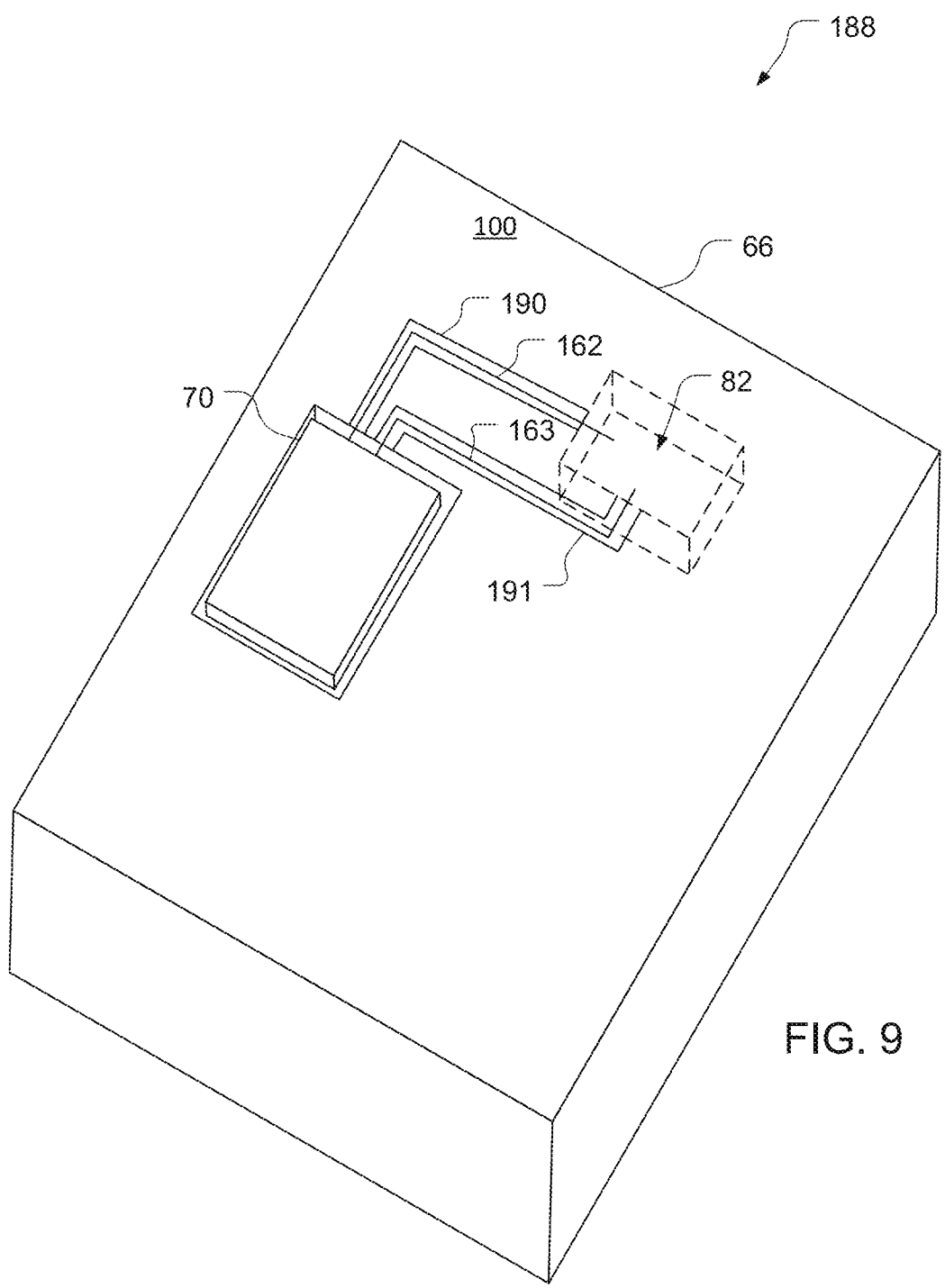
FIG. 9 is a perspective view of portions of another example of the antenna system shown in FIG. 4.

The signal conductors 162, 163 of the flex cables 90, 91, when disposed on the sheet 101 form microstrip transmission lines. The sheet 101 can provide a ground plane for the signal conductors 162, 163 as part of the transmission line. The signal conductors 162, 163 further form microstrip transmission lines when disposed over the upper wall of a respective end-fire radiator (with the upper wall providing the ground plane for the transmission line). For example, a portion 170 of the flex cable 92 disposed over an upper wall 172 of the end-fire cavity radiator 86 forms a microstrip transmission line in conjunction with the upper wall 172. Alternatively, electrical traces, instead of the sheet 101, may be provided on the surface 100 of the PCB 66 to serve as ground planes for the signal conductors to form the transmission lines. The traces would follow the paths of the corresponding signal conductors, but be wider than the signal conductors, e.g., 3-5 times wider. Referring to FIG. 9, an antenna subsystem 188 includes the PCB 66 on which electrical traces 190, 191 are disposed for the signal conductors 162, 163 corresponding to the broadside cavity radiator 82. Only the traces 190, 191, and the corresponding signal conductors 162, 163 and the corresponding cavity radiator 82, are shown in FIG. 9 for sake of simplicity of the figure. As shown, the electrical traces 190, 191 begin at an edge of a recess receiving the RFIC 70 and end at an opening of the cavity radiator. Vias may be used to provide the traces along the side wall of the PCB to serve the end-fire cavity radiators. Instead of using traces, e.g., the traces 190, 191, the flex cables may themselves include the ground planes for the microstrip lines, with the ground planes ending where the flex cables begin to overlap a cavity of a cavity radiator. Alternatively still, instead of forming microstrip transmission lines, the flex cables may include the signal conductors and upper ground planes to form stripline transmission lines when combined with metal on the PCB 66 providing lower ground planes for the stripline transmission lines. An antenna system could use combinations of microstrip and stripline transmission lines and/or different configurations of the transmission lines (e.g., fully contained in flex cables, a ground plane provided on the PCB either with a plate or with traces, etc.).

As shown in FIG. 8, the flex cables extend over respective openings of the cavity radiators to excite and receive signals of corresponding polarizations. Here, the flex cables 90, 91 extend over and overlap an opening 182 of the broadside cavity radiator 82. In this example, the flex cables 90, 91 each overlap about one quarter of the opening 182, with the opening 182 being a square of about one half of a wavelength (on each side) in the substrate of the PCB 66 at a radiating frequency of the radiator 82. The signal conductors 162, 163 terminate in respective pads 184, 186. The signal conductors 162, 163 extend selected distances over the opening 182 (i.e., partially extend over the opening 182), and the pads 184, 186 are sized, shaped, and disposed, such that the signal conductors 162, 163 can excite respective orthogonally-polarized signals in the cavity radiator 82 and receive respective orthogonally-polarized signals from the cavity radiator 82.

Figure 10:
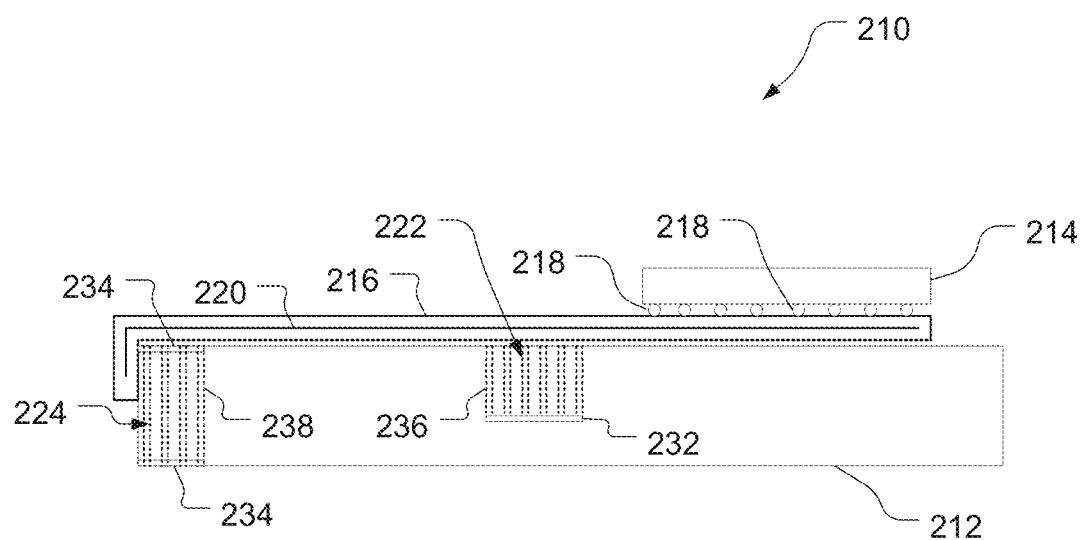
FIGS. 10-13 are side views of other examples of an antenna system shown in FIG. 3.
Figure 11:
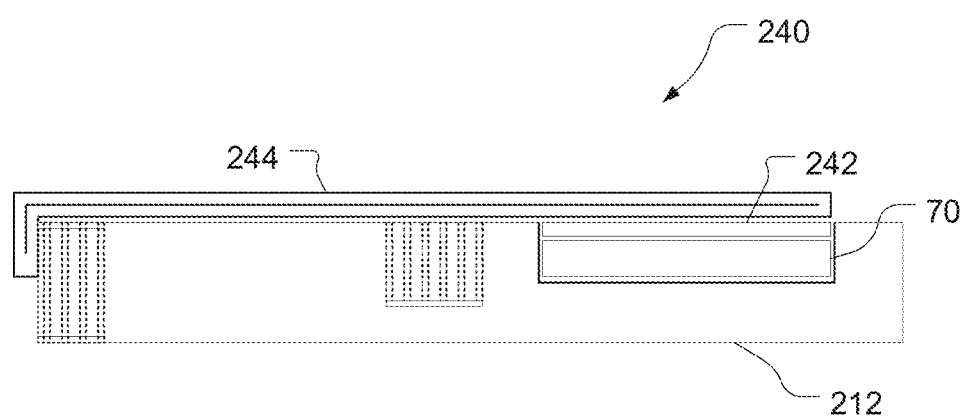

Configurations other than those discussed above may be used. For example, referring to FIGS. 10-13, antenna systems are shown that may be used as alternatives to the antenna system 62 shown in FIG. 4. Referring to FIG. 10, an antenna system 210 may include a PCB 212, an RFIC 214, and flex cables 216. The RFIC 214 in this example is disposed above the PCB 212 and the flex cables 216, and is electrically coupled to the flex cables 216 by a ball grid array of electrically-conductive blobs 218. The blobs 218 are coupled to signal conductors 220 that are disposed to couple to radiators 222, 224. Only a portion of the flex cables 216 are shown in FIG. 10 for clarity (e.g., as multiple ones of the conductors 220 are shown as a single line, and one of the flex cables 216 or conductors 220 may terminate over the radiator 222; further, coupling between the conductors 220 and conductors in the ball grid array are omitted for simplicity). Other conductors (not shown) in the flex cables 216 or implemented separate from the flex cables 216 may couple the RFIC 214 to other components implemented on the PCB 212 (e.g., the IF circuit 74). In this example, the radiators 222, 224 are cavity radiators disposed in the PCB 212 and defined by conductive sheets 232, 234 and posts 236, 238 of vias (not shown individually), respectively. As another example, referring to FIG. 11, an example antenna system 240 is similar to the example antenna system 62 shown in FIGS. 4 and 7, but an interposer 242 is provided between the RFIC 70 and flex cables 244. As in FIG. 10, only a portion of the flex cables 244 are shown in FIG. 11 for clarity. The RFIC 70 may be coupled to a PCB 246 and to the interposer 242 by respective BGAs (not shown). The interposer 242 may be coupled to the flex cables 244 by a BGA (not shown). The interposer 242 may provide a larger pitch (e.g., 100-400 microns) between connection points for the flex cables than a pitch (e.g., 50-75 microns) of connection points for the flex cables on the RFIC. An interposer may be used in other antenna system configurations, e.g., the antenna system 210 shown in FIG. 10.

Figure 12:
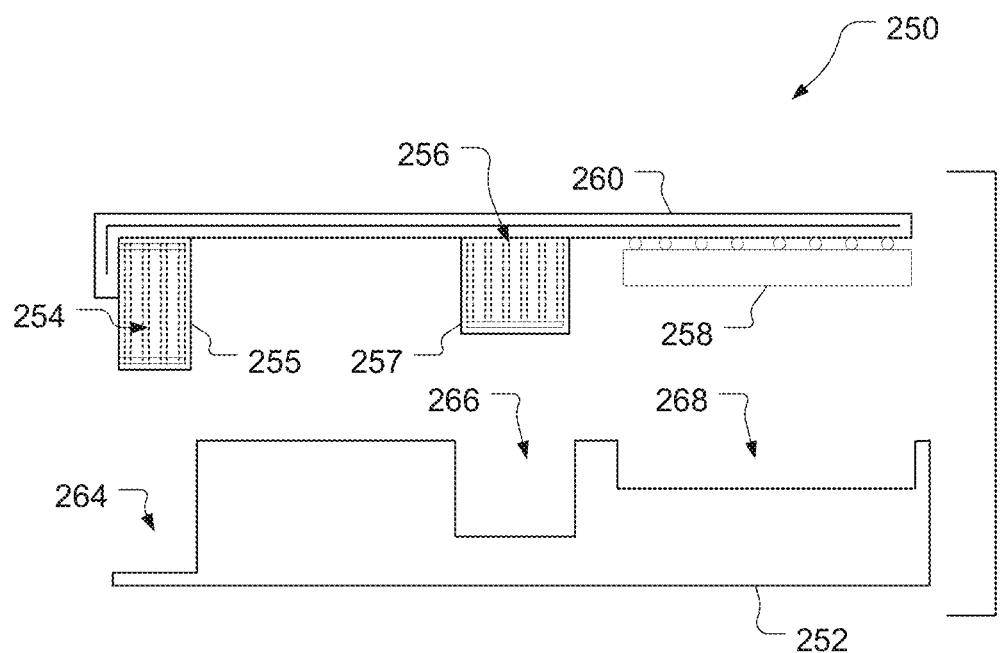
Figure 13:
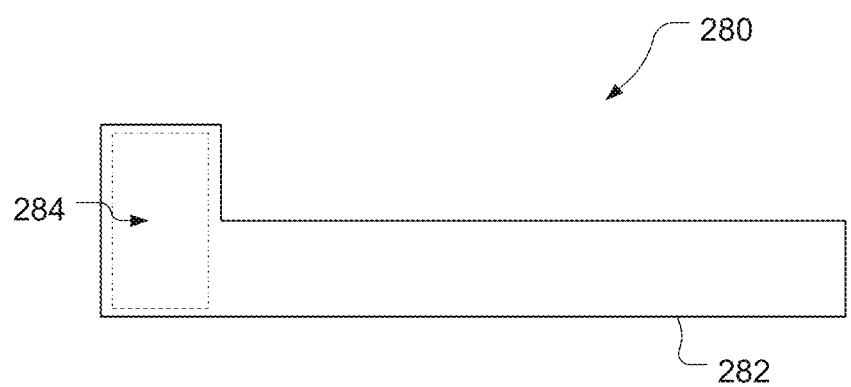

Still other configurations may be used. For example, one or more radiators may be formed in a substrate different from the substrate of the PCB. Referring to FIG. 12, an antenna system 250 includes a PCB 252, radiators 254, 256, and RFIC 258, and flex cables 260. The flex cables 260 are shown overlapping both of the (here, cavity) radiators 254, 256 for simplicity of the figure, although at least one of the flex cables 260 would terminate over the radiator 256 and all individual conductors of the flex cable may not be visible in the figure. The radiators 254, 256 in this example are cavity radiators and are disposed in substrates 255, 257, respectively. The substrates 255, 257 may be less lossy than the substrate of the PCB 252. The substrates 255, 257 may be the same material (e.g., with the same dielectric constant) or different materials (e.g., with different dielectric constants) and may have higher dielectric constants (or constant if the same material) than the dielectric constant of the substrate of the PCB 252 and/or may be less lossy than the dielectric of the PCB 252. With higher dielectric constant substrates, the radiators 254, 256 may be smaller than if disposed in the substrate of the PCB 252, thus possibly facilitating being disposed within a thickness of the PCB 252. For example, cavity radiators for radiating in the 28 GHz band in a substrate of dielectric constant 4 may have dimensions of 3.9 mm×3.9 mm×1.8 mm, with the 1.8 mm being the depth, whereas a cavity radiator for the 28 GHz frequency in a substrate with a dielectric constant of 16 may have dimensions of about 1.95 mm×1.95 mm×0.9 mm. The radiators 254, 256 may be formed separately from the PCB 252 and inserted into respective recesses 264, 266 provided by the PCB 252. The RFIC 258 may be inserted into a recess 268 provided by the PCB 252. The radiators 254, 256, the RFIC 258, and the flex cables 260 may be assembled into a unit that is then received by the PCB 252, with the radiators 254, 256 and the RFIC 258 being received by the recesses 264, 266, 268, respectively. Thus, the radiators 254, 256, while not disposed in the substrate of the PCB 252, when received by the PCB 252 are disposed within a volume defined by the length, width, and thickness of the PCB 252. While the radiators 254, 256 are illustrated as being formed at least partially by a plurality of posts, in some embodiments one or both of the radiators 254, 256 includes solid walls in place of the illustrated posts.

Still other configurations are possible. For example, referring to FIG. 13, if an antenna system 280 has a PCB 282 with a substrate with a dielectric constant of 4, a desired thickness of about 2 mm, and an end-fire, 28 GHz, cavity radiator 284, then the PCB 282 may have a localized thickness of about 4 mm to accommodate the radiator 284 and otherwise have a thickness of about 2 mm. To reduce complexity of FIG. 13, various items have been omitted from FIG. 13, e.g., feed mechanisms for cavity radiators, any other cavity radiators, and an RFIC.

Figure 14:
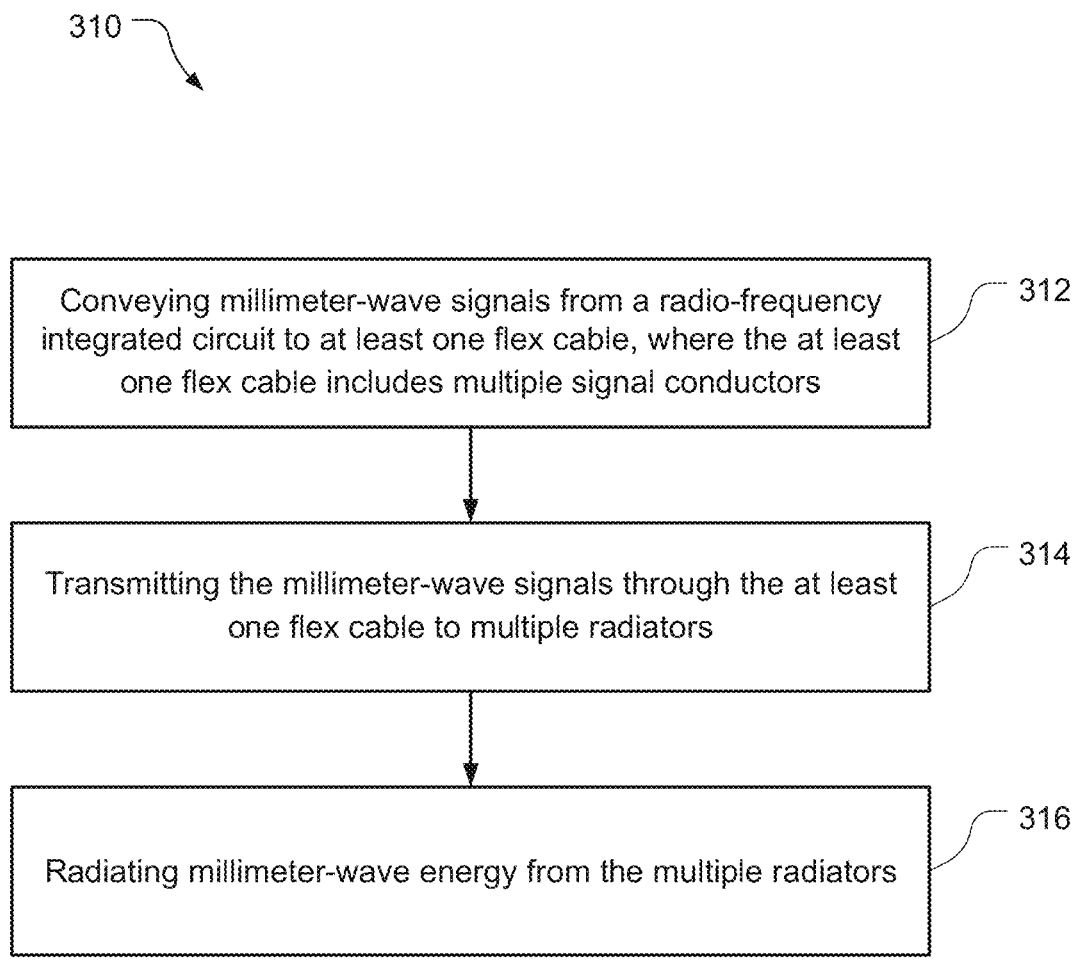
FIG. 14 is a block flow diagram of a method of radiating radio-frequency signals from a wireless mobile communication device.

Referring to FIG. 14, with further reference to FIGS. 1-13, a method 310 of radiating radio-frequency signals from a wireless mobile communication device includes the stages shown. The method 310 is, however, an example only and not limiting. The method 310 may be altered, e.g., by having stages added, removed, rearranged, combined, performed concurrently, and/or having single stages split into multiple stages.

At stage 312, the method 310 includes conveying millimeter-wave signals from a radio-frequency integrated circuit to at least one flex cable. The at least one flex cable includes one or more signal conductors. For example, the RFIC 70 transfers millimeter-wave signals to the flex cables 90-93. The RFIC 70 produces the millimeter-wave signals in response to intermediate-frequency signals received from the IF circuit 74, which produces the IF signals in response to base band signals provided to the IF circuit 74 by the processor 76.

At stage 314, the method 310 includes transmitting the millimeter-wave signals through the at least one flex cable to multiple radiators. For example, the signal conductors of the flex cables 90-93 convey respective millimeter-wave signals to the broadside cavity radiator 82 and to the end-fire cavity radiator 86. The flex cables convey the millimeter-wave signals with much less loss than if they were conveyed through the substrate of the PCB 66. The flex cables can convey the signals around edges of a PCB on or in which the radiators are disposed. For example, during assembly, one or more of the flex cables are wrapped over or bent around one or more respective edges of the PCB and positioned to excite one or more respective radiators (e.g., overlapping a portion of a cavity of a cavity radiator). The multiple radiators may include one or more cavity radiators.

At stage 316, the method 310 includes radiating millimeter-wave energy from a plurality of millimeter-wave radiators. For example, the radiators 80-82, 84-86 radiate dual-polarized millimeter-wave signals in response to being excited by respective millimeter-wave signals conveyed by respective signal conductors in respective flex cables. While the disclosure has focused on radiation of signals, and in particular radiation of millimeter-wave signals, configurations shown may also or alternatively be used for receiving signals. Antenna radiators, such as cavity radiators discussed herein, may be bi-directional devices for transmitting and receiving signals, and circuitry (e.g., RFICs) coupled to the radiators may be configured to process incoming signals alone or in addition to processing outgoing signals.

OTHER CONSIDERATIONS

Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed.

The systems and devices discussed above are examples. Various configurations may omit, substitute, or add various procedures or components as appropriate. For instance, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. A wireless communication antenna system comprising:
a radio-frequency circuit configured to couple to a printed circuit board;
a broadside radiator configured and disposed to radiate first millimeter-wave energy at a first boresight away from a broadside surface of the printed circuit board;
an end-fire radiator configured and disposed to radiate second millimeter-wave energy at a second boresight away from a side surface of the printed circuit board; and
at least one flex cable each including a substrate, the at least one flex cable including a plurality of signal conductors coupled to the radio-frequency circuit;
wherein at least one of the broadside radiator or the end-fire radiator is a cavity radiator; and
wherein respective signal conductors of the plurality of signal conductors are disposed to excite the broadside radiator and the end-fire radiator.

2. The system of claim 1, wherein the end-fire radiator is disposed within a thickness of the printed circuit board.

3. The system of claim 1, further comprising the printed circuit board, wherein the cavity radiator is disposed within the printed circuit board.

4. The system of claim 3, wherein walls of the cavity radiator comprise vias through layers of the printed circuit board.

5. The system of claim 1, further comprising the printed circuit board, wherein the radio-frequency circuit is disposed in a recess defined by the printed circuit board.

6. The system of claim 1, further comprising the printed circuit board, wherein at least one of the broadside radiator or the end-fire radiator includes a first substrate, separate from a second substrate of the printed circuit board, and wherein the at least one of the broadside radiator or the end-fire radiator is disposed in a corresponding at least one recess defined by the printed circuit board.

7. The system of claim 6, wherein the first substrate has a higher dielectric constant than the second substrate.

8. The system of claim 1, further comprising the printed circuit board, wherein the radio-frequency circuit is electrically connected to the printed circuit board by a ball-grid array.

9. The system of claim 1, wherein the end-fire radiator is the cavity radiator, and wherein a corresponding one of the plurality of signal conductors wraps around an edge of the printed circuit board and extends partially over an opening of a cavity of the end-fire radiator to excite the end-fire radiator.

10. The system of claim 9, wherein a wall bounding a portion of the cavity is disposed to provide a ground plane for a portion of the corresponding one of the plurality of signal conductors.

11. The system of claim 1, wherein the radio-frequency circuit is electrically connected to the at least one flex cable by a ball-grid array.

12. A wireless communication antenna system comprising:
a printed circuit board including an intermediate-frequency circuit;
a radio-frequency integrated circuit coupled to the intermediate-frequency circuit of the printed circuit board;
a broadside radiator configured and disposed to radiate first millimeter-wave energy at a first boresight away from a broadside surface of the printed circuit board, the broadside radiator comprising a first cavity radiator;
an end-fire radiator configured and disposed to radiate second millimeter-wave energy at a second boresight away from a side surface of the printed circuit board, the end-fire radiator comprising a second cavity radiator; and
at least one flex cable each including a substrate, the at least one flex cable including a plurality of signal conductors being coupled to the radio-frequency integrated circuit;
wherein the broadside radiator and the end-fire radiator are disposed within a volume defined by a length of the printed circuit board, a width of the printed circuit board, and a thickness of the printed circuit board; and
wherein respective signal conductors of the plurality of signal conductors are disposed to excite the broadside radiator and the end-fire radiator.

13. The system of claim 12, wherein each of the end-fire radiator and the broadside radiator is disposed within the printed circuit board.

14. The system of claim 13, wherein at least one wall of the broadside radiator and at least one wall of the end-fire radiator comprise vias through layers of the printed circuit board.

15. The system of claim 12, wherein the radio-frequency integrated circuit is disposed in a recess defined by the printed circuit board.

16. The system of claim 12, wherein at least one of the broadside radiator or the end-fire radiator includes a first substrate, separate from a second substrate of the printed circuit board, and wherein the at least one of the broadside radiator or the end-fire radiator is disposed in a corresponding at least one recess defined by the printed circuit board, the first substrate having a higher dielectric constant than the second substrate.

17. The system of claim 12, wherein the radio-frequency integrated circuit is electrically connected to the printed circuit board by a ball-grid array.

18. The system of claim 12, wherein a corresponding one of the plurality of signal conductors wraps around an edge of the printed circuit board and extends partially over an opening of a cavity of the end-fire radiator to excite the end-fire radiator.

19. The system of claim 18, wherein a wall bounding a portion of the end-fire radiator is disposed to provide a ground plane for a portion of the corresponding one of the plurality of signal conductors.

20. The system of claim 12, wherein the printed circuit board comprises a plurality of traces to provide ground planes for at least some of the plurality of signal conductors such that the plurality of traces and the at least some of the plurality of signal conductors are microstrip transmission lines.

21. A wireless communication antenna system comprising:
  a radio-frequency integrated circuit;
  a printed circuit board including a intermediate-frequency circuit coupled to the radio-frequency integrated circuit, the printed circuit board including:
    a first radiator array comprising a first plurality of cavity radiators each configured and disposed to radiate first millimeter-wave energy at a first boresight away from a broadside surface of the printed circuit board; and
    a second radiator array comprising a second plurality of cavity radiators each configured and disposed to radiate second millimeter-wave energy at a second boresight away from a side surface of the printed circuit board; and
  at least one flex cable each including a substrate, the at least one flex cable including a plurality of signal conductors coupled to the radio-frequency integrated circuit and being disposed to excite the first plurality of cavity radiators and the second plurality of cavity radiators.

22. The system of claim 21, wherein walls of each of the first plurality of cavity radiators and walls of each of the second plurality of cavity radiators comprise vias through layers of the printed circuit board.

23. The system of claim 21, wherein the radio-frequency integrated circuit is disposed in a recess defined by the printed circuit board.

24. The system of claim 21, wherein the radio-frequency integrated circuit is electrically connected to the printed circuit board by a ball-grid array.

25. The system of claim 21, wherein the printed circuit board comprises a plurality of traces to provide ground planes for at least some of the plurality of signal conductors such that the plurality of traces and the at least some of the plurality of signal conductors are microstrip transmission lines.

26. The system of claim 21, further comprising an interposer disposed between the radio-frequency integrated circuit and the at least one flex cable and electrically coupled to the radio-frequency integrated circuit and the at least one flex cable.

* * * * *